(12) United States Patent
Mertens

(10) Patent No.: US 12,549,179 B2
(45) Date of Patent: Feb. 10, 2026

(54) CASCODED POWER SWITCHES USABLE IN DC-DC CONVERTER APPLICATIONS

(71) Applicant: NXP USA, Inc., Austin, TX (US)

(72) Inventor: Robert Matthew Mertens, Crystal Lake, IL (US)

(73) Assignee: NXP USA, Inc., Austin, TX (US)

( * ) Notice: Subject to any disclaimer, the term of this patent is extended or adjusted under 35 U.S.C. 154(b) by 7 days.

(21) Appl. No.: 18/651,033

(22) Filed: Apr. 30, 2024

(65) Prior Publication Data

US 2025/0337410 A1   Oct. 30, 2025

(51) Int. Cl.
*H02M 3/157* (2006.01)
*H02M 3/158* (2006.01)
(Continued)

(52) U.S. Cl.
CPC ........ *H03K 17/6871* (2013.01); *H02M 3/157* (2013.01); *H02M 3/158* (2013.01);
(Continued)

(58) Field of Classification Search
CPC .......... H02M 3/00; H02M 3/02; H02M 3/157; H02M 3/158; H02M 3/1582; H03K 17/687; H03K 17/6871; H03K 17/302; H03K 19/0185; H03K 19/018507; H03K 19/018521; H03K 3/011
(Continued)

(56) References Cited

U.S. PATENT DOCUMENTS

| 7,417,382 B2 | 8/2008 | Lin |
| 9,035,625 B2 | 5/2015 | Burns et al. |

(Continued)

FOREIGN PATENT DOCUMENTS

| EP | 4120567 A1 | 1/2023 |
| WO | WO-2022250462 A1 | 12/2022 |
| WO | 2023087268 A1 | 5/2023 |

OTHER PUBLICATIONS

TI Literature No. SLUP378: "Control and Design Challenges for Synchronous Rectifiers," Power Supply Design Seminar, Reproduced from 2018 Texas Instruments Power Supply Design Seminar, SEM2300, Topic 2, pp. 1-24.

(Continued)

*Primary Examiner* — Hai L Nguyen
(74) *Attorney, Agent, or Firm* — Joanna G. Geld

(57) ABSTRACT

A cascoded power switch includes a high-side (HS) switch coupled between an output node configured to provide an output voltage and a first voltage supply terminal configured to provide a first voltage supply, and a low-side (LS) switch coupled between the output node and a second voltage supply terminal configured to provide a second voltage supply. The LS switch includes a first transistor coupled between a middle node and the second voltage supply terminal, and a second transistor coupled between the middle node and the output node. The LS driver has a voltage monitoring circuit configured to receive a first control signal which, when negated, turns off the HS switch. The voltage monitoring circuit includes a logic circuit having a first input configured to receive the first control signal and a second input coupled to the middle node, and an output coupled to a control electrode of the first transistor.

20 Claims, 9 Drawing Sheets

(51) Int. Cl.
  *H03K 17/30*      (2006.01)
  *H03K 17/687*     (2006.01)
  *H03K 19/0185*    (2006.01)

(52) U.S. Cl.
  CPC ... *H03K 17/302* (2013.01); *H03K 19/018528* (2013.01); *H03K 2217/0063* (2013.01); *H03K 2217/0072* (2013.01)

(58) Field of Classification Search
  USPC ................................................. 327/108, 112
  See application file for complete search history.

(56) References Cited

U.S. PATENT DOCUMENTS

| | | | |
|---|---|---|---|
| 9,985,526 B1 | 5/2018 | Oak | |
| 12,113,442 B2 * | 10/2024 | Amin | H02M 1/0058 |
| 12,308,831 B2 * | 5/2025 | Mertens | H03K 17/102 |
| 2013/0335048 A1 | 12/2013 | Herzog et al. | |
| 2014/0368240 A1 | 12/2014 | Shelton et al. | |

OTHER PUBLICATIONS

U.S. Appl. No. 18/591,341, Mertens, Robert Matthew: "Current Comparator Usable in DC-DC Converter Applications," filed Feb. 29, 2024.

* cited by examiner

CASCODED POWER SWITCHES USABLE IN DC-DC CONVERTER APPLICATIONS

CROSS-REFERENCE TO RELATED APPLICATION

This application is related to U.S. patent application Ser. No. 18/651,058, filed on even date, entitled "CASCODED POWER SWITCHES USABLE IN DC-DC CONVERTER APPLICATIONS," naming Robert M. Mertens as inventor, and assigned to the current assignee hereof.

BACKGROUND

Field

This disclosure relates generally to integrated circuits, and more specifically, to cascoded power switches usable in DC-DC converter applications.

Related Art

Direct current (DC)-direct current (DC) converters convert a source of DC from one voltage level to another, and are commonly used in a variety of applications, such as in low power applications. In the case of a buck or step-down converter, the output voltage is lower than the input voltage, and of the same polarity. In one example, a buck converter is implemented using a high side power switch and a low side power switch, in which a need exists for activating the switches while managing inductive voltage drops in the input supply, preventing cross conductance between the HS and LS switches, or protecting switches from damaging voltages, or combinations thereof.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
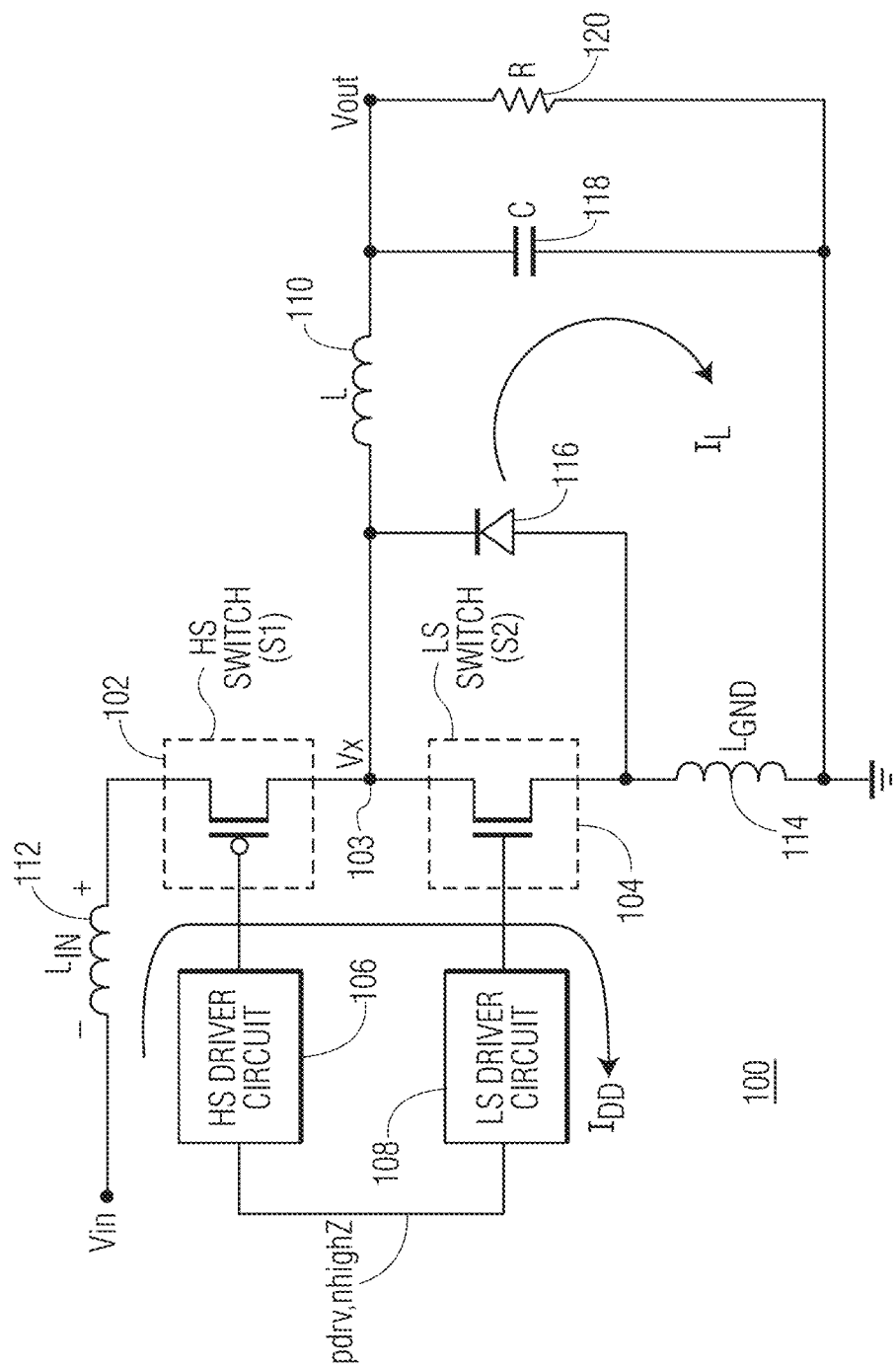
FIG. 1 illustrates, in partial schematic form and partial block diagram form, a DC-DC buck converter having high side (HS) power switch, S1, and a low side (LS) power switch, S2, in accordance with one embodiment of the present invention.

In a synchronous DC-DC buck converter having a high-side (HS) power switch and a low-side (LS) power switch, each of the HS power switch and the LS power switch is implemented with cascoded devices and may collectively be referred to as a cascoded power switch. In various embodiments, driver circuits are provided for each of the HS and LS switches to control the turning on and off of the power switches, which may help control the $dI_{DD}/dt$ and $g_m$ through the HS switch (which may limit the impact of inductive parasitics) and which may help prevent cross conductance (in which both HS and LS are on, i.e., conductive). For example, in various embodiments, the driver circuits include one or more voltage monitor circuits which observe the voltage at a circuit node between the HS and LS switches by using internal nodes of the cascoded devices to control the gate voltages of the HS and LS switches.

For example, in one aspect, six p-channel metal-oxide semiconductor (PMOS) transistors are used to implement the HS switch (S1) in which they are grouped to include three series connected pairs of parallel devices (resulting in S1 having a left half and right half, each including three of the devices). A gate driver circuit controls a first PMOS transistor closest to the power supply in the left half of S1 such that the gate is slewed slowly enough so that the turning on of S1 does not cause excessive $dI_{DD}/dt$. A voltage monitor circuit observes the voltage at the circuit node between S1 and S2 by monitoring a middle node of the cascoded PMOS transistors via a logic circuit and asserting a first control signal when the monitoring indicates that S1 has sufficiently turned on. In response to assertion of the first control signal, gate driver circuits of the right half of S1 turn on the devices of the right half, thus reducing the resistance of S1. In this example, the left and right halves of S1 are partitioned so that the $g_m$ of S1 is reduced as the gate of the first PMOS transistor is slewed during initial turn-on, which permits a faster gate voltage slew rate to cause the desired $dI_{DD}/dt$. The increased slew rate reduces the time from initiating the turn on of S1 until the first PMOS transistor's current begins increasing (i.e. delay until reaching the first PMOS transistor's threshold voltage.

In another aspect, two series connected n-channel metal-oxide semiconductor (NMOS) transistors are used to implement the LS switch (S2). A voltage monitor is coupled to a middle node of the cascoded NMOS transistors, and includes a logic circuit which is sensitive to both the logic state of the HS switch and the logic state of the voltage monitor. In this example, the logic circuit operates to control a gate voltage of a first NMOS transistor of S2 which is closest to the power supply (e.g. Vss_DCDC) such that S2 will activate after S1 has begun to turn off and the middle node of the cascoded NMOS transistors has fallen to a sufficiently low voltage. The logic circuit can be implemented using any combination of logic gates, such as an OR gate, AND gates, SR latch, etc.

FIG. 1 illustrates, in partial block diagram and partial schematic form, a DC-DC converter 100 having a HS power switch 102, illustrated as a PMOS transistor, and a LS power switch 104, illustrated as an NMOS transistor, in accordance with one embodiment of the presents invention. DC-DC converter 100 is configured as a buck or step-down DC-DC converter which decreases voltage from its input voltage (Vin) to its output voltage (Vout), while increasing current from its input to its output (e.g. a load, represented as a resistor 120). In the illustrated embodiment, converter 100 is a switching converter, with power switches 102 and 104 which may simply be referred to herein as S1 and S2, respectively. Such switching converters typically provide for greater power efficiency as compared to linear regulators (which do not typically step up output current). (Note that, as will be described below, each power switch can be implemented with multiple transistors, in which the power switches may be referred to collectively as the power stage of DC-DC converter 100. Also, note that either S1 or S2, or S1 and S2 collectively, can be referred to as a cascoded power switch.) In addition to the power stage (e.g. power switches 102 and 104), converter 100 includes a diode 116 and energy storage elements inductor (L) 110 and capacitor (C) 118. Note that converter 100 of FIG. 1 is illustrated as a synchronous buck converter, which includes both S1 and S2, as opposed to an asynchronous converter which would not include S2, but instead rely on a diode (such as diode 116) to provide the functionality of S2.

In the illustrated embodiment, a first current electrode of S1 is coupled to receive an input voltage, Vin, and a second current electrode is coupled to a first circuit node 103 at a first terminal of inductor 110. Circuit node 103 is located between S1 and S2, and the voltage at circuit node 103 is labeled Vx (corresponding to a voltage at a first internal node of the power stage of converter 100, between S1 and S2). In one embodiment, Vin may be coupled to a first voltage supply terminal configured to provide a first supply voltage, Vdd_DCDC. A first current electrode of S2 104 is coupled to circuit node 103 and the second current electrode of S1, and has a second current electrode coupled to a second voltage supply terminal configured to supply a second supply voltage, Vss_DCDC, in which Vdd_DCDC is greater than Vss_DCDC. In one embodiment, Vss_DCDC is ground, such as, e.g., a local AC ground. Note that, as used herein, the first and second voltage supply terminals may simply be referred to by the supply voltage provided by the terminal (e.g. as Vdd_DCDC and Vss_DCDC, respectively). A second terminal of inductor 110 is coupled to a first terminal of capacitor 118 and provides an output voltage, Vout, of the converter, and a second terminal of capacitor 118 is coupled to Vss_DCDC. A cathode of diode 116 is coupled to node 103, and an anode of diode 116 is coupled to the second current electrode of S2. A control electrode of S1 is coupled to a HS driver circuit 106, and a control electrode of S2 is coupled to a LS driver circuit 108. Since each of S1 and S2 can be implemented as multiple transistors, each of HS and LS driver circuits 106 and 108 may include circuitry configured to drive any of the transistors of S1 and S2, respectively.

A converter can operate in either a continuous conduction mode (CCM) or in discontinuous conduction mode (DCM). In CCM, the power switches (e.g. S1 and S2) are alternately turned on and off such that Vx at node 103 forms a square wave between a high voltage and a low voltage, in which while Vx is at the high voltage, the current through inductor 110 (labeled as $I_L$) increases as inductor 110 charges, and while Vx is at the low voltage, $I_L$ decreases as inductor 110 discharges. In this manner, Vout is provided as an average level of Vx, between the high and low voltages of Vx, in which the LC filter formed by inductor 110 and capacitor 118 operates to flatten out Vout. Note that $I_L$ of FIG. 1 represents the loop current going through L 110, the parallel combination of R 120 and C 118, and the parallel combination of S2 and diode 116. Note also that while Vout may be considered the output voltage of the converter, Vx can be considered the output voltage of the power stage of the converter.

In some embodiments, operating in DCM allows for improved efficiency as compared to operating in CCM. In the illustrated embodiment, converter 100 is configured to run in DCM. Unlike in CCM, when a one of the two power switches S1 and S2 is always on, so that It is always rising or falling, in DCM, both power switches are disabled at some times. For example, in DCM, first S1 is turned on to increase $I_L$ as inductor 110 charges, then S1 is turned off and S2 is turned on so that $I_L$ decreases as inductor 110 discharges, and when $I_L$ reaches zero, S2 is turned off (while S1 remains off), causing node 103 to become high impedance (Z). Therefore, to avoid dissipating energy stored in inductor 110, S2 is kept on until $I_L$ decreases to zero, and then disabled right when $I_L$ reaches zero. In one embodiment, a digital signal (nhighZ) is asserted to indicate that both S1 and S2 should be disabled (i.e. turned off). This signal may be generated, for example, by a zero crossing circuit, as known in the art, which indicates when $I_L$ has reached zero.

Referring to the illustrated embodiment of FIG. 1, digital input signals (also referred to as control signals), pdrv and nhighZ, are received by each of HS and LS driver circuits 106 and 108 which are used to control the power switches S1 and S2 to be in an on-state (with S1 on and S2 off, thus driving Vx high), an off-state (with S2 on and S1 off, thus driving Vx low), and a high-impedance (Z) state (with both S1 and S2 off, in which Vx is Z). In one embodiment, pdrv is used to indicate when the power switches should be driven in the on state and, as described above, nhighZ is used to indicate when the power switches should be in the Z state. In one embodiment, pdrv can be implemented as a pulse-width modulated (PWM) signal which results in S1 and S2 being alternately on and off, in which nhighZ is used to indicate those times when both S1 and S2 should be off. In one embodiment, when pdrv is asserted to a logic level high (regardless of the value of nhighZ), the power switches are in the on-state (S1 on and S2 off). However, when pdrv is negated to a logic level low, the power switches are in the off-state (S2 on and S1 off) when nhighZ is also negated to a logic level low and in the high Z state (S1 and S2 both off) when nhighZ is asserted to a logic level high. Note that in alternate embodiments, different digital signals may be used for driver circuits 106 and 108 to control the states of the power switches to control the generation of Vx. In one embodiment, each of pdrv and nhighZ can be provided by circuitry within converter 100 or may be received from outside converter 100.

As illustrated in FIG. 1, buck converter 100 also includes parasitic supply inductances, illustrated as parasitic inductor 112 ($L_{IN}$) and parasitic inductor 114 ($L_{GND}$). Converter 100 also includes two current loops, $I_{DD}$ (through Vin, S1, and the parallel combination of S2 and diode 116) and $I_L$ (through L 110, the parallel combination of R 120 and C 118, and the parallel combination of S1 and diode 116), in which $I_{DD}$ is rapidly switched while $I_L$ varies slowly in comparison. Note that in an on-state (described below), in which S1 is on and S2 is off, $I_{DD}$ and $I_L$ are equal, thereby cancelling the current through the parallel combination of S2 and diode 116 (for this pair of devices $I_{DD}$ and $I_L$ have opposite directions).

Figure 2:
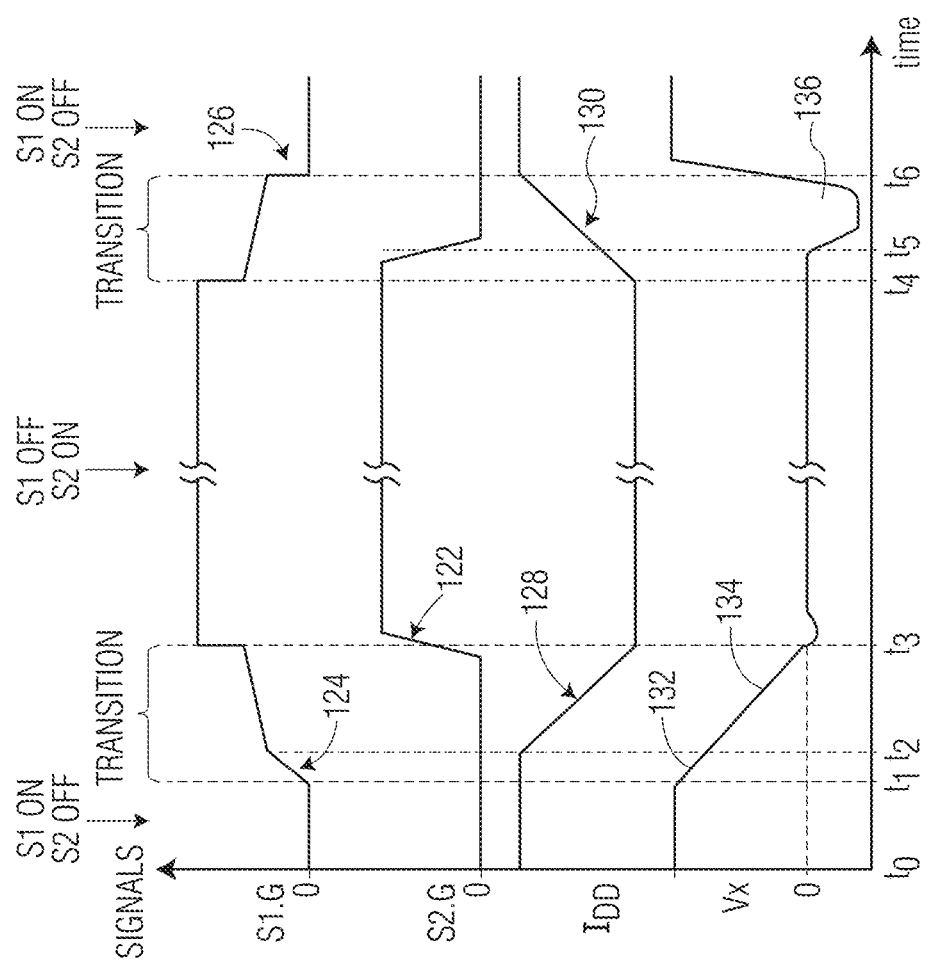
FIG. 2 illustrates a timing diagram with waveforms for a plurality of signals within the converter of FIG. 1, in accordance with one embodiment of the present invention.

FIG. 2 illustrates waveforms for various signals within converter 100 of FIG. 1, in accordance with one embodiment of the present invention. Note that S1.G refers to the voltage on the gate (i.e. control electrode) of S1, and S2.G refers to the voltage on the gate (i.e. control electrode) of S2. FIG. 2 illustrates a transition of the power switches from the one state to the off state, then back to the on state. At time t0, the power switches are in the on state in which S1 is on and S2 is off. At time t1, in response to beginning the turning off of S1 (e.g. in response to negation of pdrv), S1.G begins to rise (as illustrated with edge 124), and Vx begins to decrease due to the increase in resistance of S1 (as illustrated with edge 132). At time t2, due to the effect of a Miller capacitance, the rise on S1.G slows down (e.g. almost flattens out for a portion), and the voltage on Vx continues to drop (in which S1 acts as current source during this time, as illustrated with edge 134) while $I_{DD}$ also starts to decrease (illustrated with edge 128). At time t3, when Vx reaches zero, the voltage on S2.G quickly goes high, turning on S2, which also results in S1 fully turning off, placing the power switches in the off state. At time t4, in response to beginning turning on of S1 to transition back to the on state (e.g. in response to assertion of pdrv), S1.G begins to fall and $I_{DD}$ begins to rise again. Shortly thereafter, at time t5, S2.G is driven low to turn off S2 while S1.G continues to fall. Note that a dip 136 in Vx occurs at time t5, due to diode 116, to help ensure that any cross conduction due to both S1 and S2 being on is avoided. That is, dip 136 prevents cross conduction by ensuring that S2.G is sufficiently off before S1.G is fully turned on, at time t6 (as illustrated with edge 126). Between time t4 and time t6, $I_{DD}$ increases again, as illustrated with edge 130.

Note that it is desirable to control the timing of the voltage transition on S1.G, as it affects the slope of $I_{DD}$ (slopes of 128 and 130). For example, as S1 is beginning to turn off (corresponding to edge 124), S1 is initially turned off at a moderate speed because the voltage on S1.G does not yet control $dI_{DD}/dt$. However, as Vx drops lower, S1 begins acting as a current source, so that its gate voltage starts acting as a current mirror. The drain voltage (at the second current electrode) of S1, with the source voltage (at the first current electrode) of S1 now high (e.g. at approximately Vdd_DCDC), will increase as it goes from triode mode to saturation mode, and this change in voltage can operate a logic gate (as will be described below). Also, as S1 is finishing turning back on (corresponding to edge 126), the previous process reverses in which the drain of S1 being at Vdd_DCDC goes from saturation to triode mode, indicating that the switch is on, and the voltage change can toggle a logic gate, thus speeding up the full turn on of S1. It is also desirable to control the timing of edge 122 to ensure that Vx drops low enough when S1 is turned off before turning on S2, to avoid cross conductance. Details of the timing for edges 124, 126, and 122 will be described in further detail below in reference to the details of S1 and S2 illustrated in FIG. 3.

Referring back to FIG. 1, in one embodiment, Vdd_DCDC is a high voltage (e.g. 3.3V) which is higher than the voltage rating of devices used with converter 100. For example, the devices within converter 100 may be low voltage devices with a maximum voltage rating of less than Vdd_DCDC. For example, the maximum voltage rating may be only 1.8V, in which a voltage of greater than (1.8V+10%) over any two terminals of the device can damage the device. Therefore, each low voltage device should be protected from operating outside its maximum voltage rating (i.e. outside its safe operation area (SOA)). In one embodiment, each device used to implement each of S1 and S2 are low voltage devices. In the ideal case version of FIG. 1, without the presence of the parasitic inductors, S1 is the power switch which sets Vx and $dI_{DD}/dt$. If S1 can conduct all of $I_L$, then Vx is high (pulled up to approximately Vin, i.e. Vdd_DCDC), otherwise, Vx is low (at approximately zero). Also, note that S2 reduces the voltage drop across diode 116 (as compared to an asynchronous buck converter) for improved efficiency. However, with the presence of the parasitic supply inductances, if S1 is not fully on, then $V_{S1}$ can be expressed as Vin+Vdiode$-(L_{IN}+L_{GND})$ $dI_{DD}/dt$, and with S1 fully on, $V_{S2}$=Vin$-(L_{IN}+L_{GND})$ $dI_{DD}/dt$. Therefore, $dI_{DD}/dt$ is strongly linked to reliability due to the parasitics, in which the voltage on Vin can go even higher than Vdd_DCDC (e.g. higher than 3.3V).

Therefore, to improve reliability, each of S1 and S2 is implemented as multiple cascoded transistors in order to protect against any one of the devices from seeing greater than its maximum voltage rating. For example, as will be discussed in reference to FIG. 3, S1 includes three cascoded transistors and S2 includes two cascoded transistors. With cascoding though, mid-rail biases are used to provide bias voltages which fall between Vdd_DCDC and Vss_DCDC. For example, for S1 (the PMOS power switch), a mid-rail bias VBP is generated which may be, for example, Vdd_DCDC$-1.8$V=1.5V, and for S2 (the NMOS power switch), a mid-rail bias VBN is generated which may be, for example, 1.8V. These voltage values will be used in the descriptions below, however, in alternate embodiments, different mid-rail voltage values may be used, based on the value of Vdd_DCDC and the voltage rating of the devices. These bias voltages may be internally generated by voltage generators within converter 100 or may be received from voltage generators outside converter 100. Further, with the use of cascoded transistors, controlling each of S1.G and S2.G includes controlling the gate voltage of each transistor of the cascoded transistors within S1 and S2. That is, gates in S1 and S2 may be driven to these bias voltages to control them, too, instead of only using the supply voltages.

In addition to cascoding devices to handle the DC voltage drops, a tradeoff exists between the transition delay and $dI_{DD}/dt$. For example, assuming that S1 is implemented with three cascoded transistors between Vdd_DCDC and Vx, in which the top transistor closest to Vdd_DCDC is P0, the delay is inversely proportion to $|dV_{GP0}/dt|$ (in which $V_{GP0}$ is the voltage on the gate of P0). Therefore, it is desirable to have a fast $|dV_{GP0}/dt|$ in order to result in a smaller delay. However, it is also desirable to have a smaller $dI_{DD}/dt$, in which $dI_{DD}/dt$ can be represented by $g_{mP0}*|dV_{GP0}/dt|$, in which $g_{mp0}$ represents the transconductance of P0. Therefore, if $dI_{DD}/dt$ is made smaller for reliability, the resulting delay may be too large. To address these tradeoffs, as will also be seen in reference to FIG. 3, the three cascoded devices of S1 are split into two halves in parallel with each other, in which one half (e.g. the left half in FIG. 3) operates to limit $|dV_{GP0}/dt|$, while the other half (e.g. the right half in FIG. 3) turns on later than the left half to reduce the resistance, thereby keeping the S1 resistance low while reducing the $g_{mp0}$.

Figure 3:
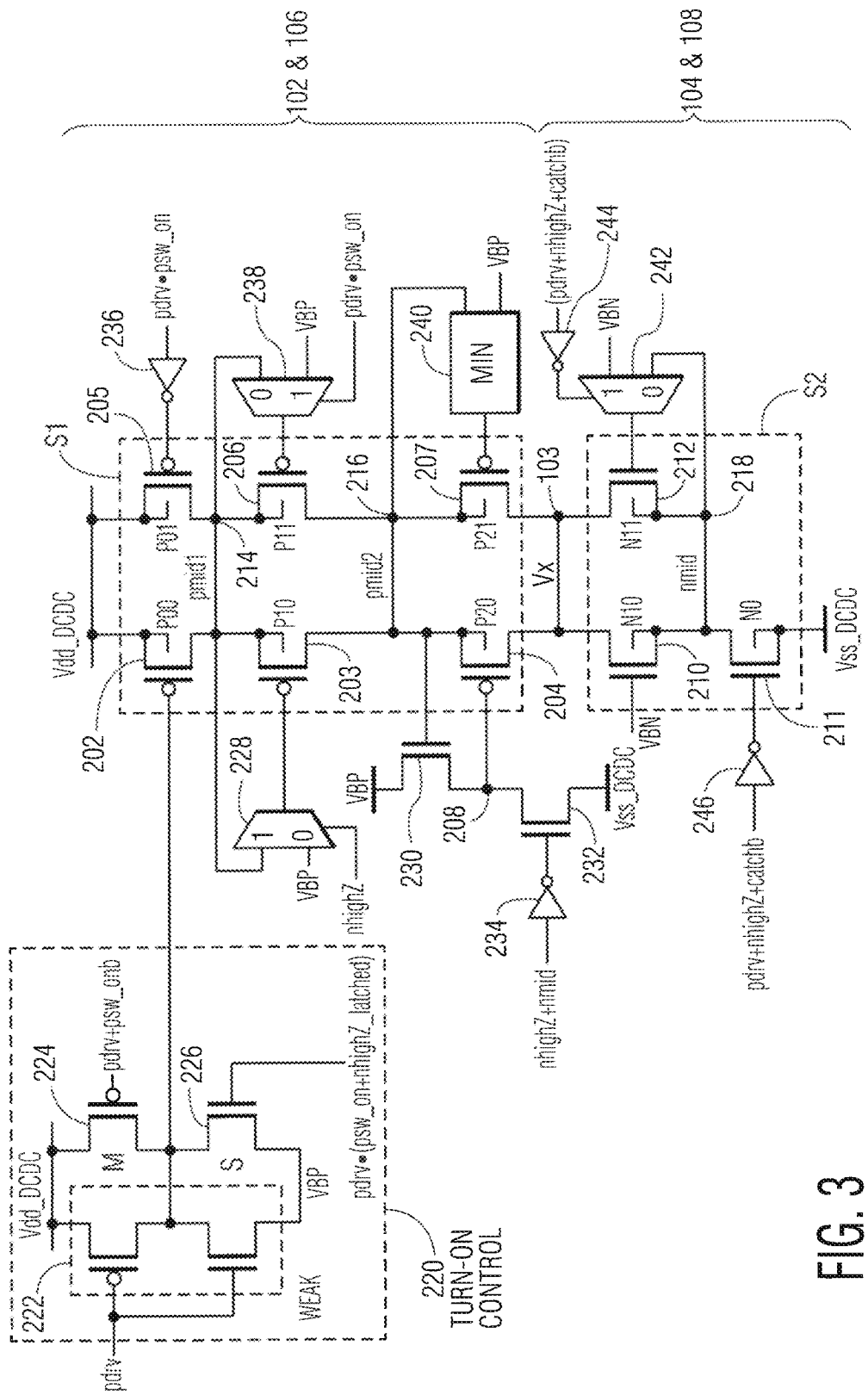
FIG. 3 illustrates, in partial schematic form and partial block diagram form, further details of a portion of the converter of FIG. 1, in accordance with one embodiment of the present invention.

FIG. 3 illustrates, in partial schematic and partial block diagram form, a portion of converter 100 including HS switch 102 (i.e. S1) and corresponding HS driver circuit 106 as well as LS switch 104 (i.e. S2) and corresponding LS driver circuit 108, in accordance with an embodiment of the present invention. HS switch 102 (S1) is implemented with cascoded PMOS transistors 202-204 and cascoded PMOS transistors 205-207, in which transistors 202-204 form one half (i.e. a left side) of S1 and are coupled in parallel with transistors 205-207 which form another half (i.e. a right side) of S1. Therefore, S1 includes 6 PMOS transistors arranged as three series connected pairs of parallel devices: 202/205, 203/206, and 204/207 The left side of S1 includes transistor P00 202, transistor P10 203, and transistor P20 204, and the right side of S1 includes transistor P01 205, transistor P11 206, and transistor P21 207. Note that for simplicity, transistors 202-207 may be referred to as P00, P10, P20, P01, P11, and P21, respectively. LS switch 104 (S2) is implemented with cascoded NMOS transistor N10 210 and NMOS transistor N0 211, and an NMOS transistor N11 212 coupled in parallel with transistor 210. Each of transistors 210-212 may be simply be referred to as N10, N0, and N11, respectively.

A first current electrode (e.g. source) of P00 is coupled to Vdd_DCDC (i.e. is coupled to receive Vin) and a second current electrode (e.g. drain) of P00 is coupled to a circuit node 214, which provides a first middle node voltage labeled pmid1. A first current electrode (e.g. source) of P01 is coupled to Vdd_DCDC and a second current electrode (e.g. drain) of P01 is coupled to node 214, such that P01 is coupled in parallel with P00. A control electrode (e.g. gate) of P00 is coupled to receive a gate voltage from a turn-on control circuit 220, and a control electrode (e.g. gate) of P01 is coupled to receive a gate voltage from an inverter 236. Each of turn-on control circuit 220 and inverter 236 form part of HS driver circuit 106.

A first current electrode (e.g. source) of P10 is coupled to the second current electrode of P00 at circuit node 214, and a second current electrode (e.g. drain) of P10 is coupled to a circuit node 216, which provides a second middle node voltage labeled pmid2. A first current electrode (e.g. source) of P11 is coupled to a second current electrode of P01 at circuit node 214, and a second current electrode (e.g. drain) of P11 is coupled to circuit node 216, such that P11 is coupled in parallel with P10. A control electrode (e.g. gate) of P10 is coupled to receive a gate voltage from a multiplexer (MUX) 228, and a control electrode (e.g. gate) of P11 is coupled to receive a gate voltage from a MUX 238. Each of MUXes 228 and 238 form part of HS driver circuit 106.

A first current electrode (e.g. source) of P20 is coupled to the second current electrode of P10 at circuit node 216, and a second current electrode (e.g. drain) of P20 is coupled to Vx at circuit node 103. A first current electrode (e.g. source) of P21 is coupled to a second current electrode of P11 at circuit node 216, and a second current electrode (e.g. drain) of P21 is coupled to Vx at circuit node 103, such that P21 is coupled in parallel with P20. A control electrode (e.g. gate) of P20 is coupled to a circuit node 208, and a control electrode (e.g. gate) of P21 is coupled to receive a gate voltage from a minimum-of-two (min-of-two) circuit 240. An NMOS transistor 230 has a first current electrode coupled to VBP, a control electrode coupled to circuit node 216, and a second current electrode coupled to circuit node 208, and an NMOS transistor 232 has a first current electrode coupled to circuit node 208, a second circuit node coupled to Vss_DCDC, and a control electrode coupled to receive an output of an inverter 234. Each of transistors 230 and 232 and min-of-two circuit 240 form part of HS driver circuit 106. In one embodiment, NMOS transistor 232 can be formed with multiple cascoded devices. For example, an additional NMOS transistor can be coupled between node 208 and the first current electrode of transistor 232, in which a gate of this additional NMOS transistor is coupled to receive VBN.

Each of P00, P10, P20, P01, P11, and P21 have their sources connected to their bodies. HS driver circuit 106 receives pdrv, nhighZ, psw_on, as well as pmid1 and pmid2, and controls the gates of P00, P10, P20, P01, P11, and P21. Note that psw_on is a control signal generated by a Vx monitoring circuit 500 which can also be included as part of turn-on control circuit 220 and will be described in reference to FIG. 5 below. While pdrv indicates when S1 should be on, psw_on indicates when the left side of S1 is actually on. (Also, note that, although not illustrated in FIG. 3, level shifters may be used on any of the control signals to appropriately shift the voltages up or down due to voltage tolerances in various circuit portions.) HS driver circuit 106 is also implemented using low voltage devices (e.g. 1.8V devices) and is therefore powered with the same power as S1, between Vdd_DCDC and VBP, which limits the voltage swing to 1.5V to 3.3V. Note that converter 100 may be implemented using split grounds in which different ground terminals may be used for different portions of converter 100 (in which, in one embodiment, the ground terminals can be connected or shorted to each other at the printed circuit board (PCB)).

Continuing with LS switch 104 (S2) and corresponding LS driver circuit 108, N0 has a first current electrode (e.g. source) coupled to Vss_DCDC, a second current electrode (e.g. drain) coupled to a circuit node 218 which provides a third middle node voltage labeled nmid, and a control electrode coupled to receive a gate voltage from an inverter 246. A first current electrode (e.g. source) of N10 is coupled to circuit node 218, a control electrode is coupled to VBN, and a second current electrode (e.g. drain) is coupled to circuit node 103. A first current electrode (e.g. source) of N11 is coupled to circuit node 218, a second current electrode (e.g. drain) of N11 is coupled to circuit node 103, such that N11 is coupled in parallel with N10. A control electrode of N11 is coupled to receive a gate voltage from a MUX 242. Each of inverter 246 and MUX 242 (and an inverter 244 which provides a select signal to MUX 242) form part of LS driver circuit 108.

Each of N0, N10, and N11 have their sources connected to their bodies. LS driver circuit 108 also receives pdrv and nhighZ, as well as nmid, to control the gates of N0 and N11. In addition, LS driver circuit 108 also receives a control signal catchb (which is the inverse of control signal catch), in which catchb is generated by a Vx monitoring circuit (to be described below in reference to FIGS. 6-9), which can also be included as part of LS driver circuit 108. A logical combination of pdrv, nhighZ, and catchb is provided, via inverter 246, to control the gate of N0, which is the transistor of S2 located closest to the power supply (e.g. Vss_DCDC). In one embodiment, catchb is generated to indicate when Vx falls sufficiently low upon a transition of the power switches from the on state (in which S1 is on and S2 is off) to the off state (in which S1 is off and S2 is on) to indicate when S2 should be turned on. In this embodiment, catchb is an active low signal in which it is asserted to a logic level zero to indicate that Vx has fallen sufficiently low (as determined, e.g., by the trip point of a logic gate generating catchb or by a common gate amplifier) and is negated to a logic level one otherwise.

In operation, at a high level, when pdrv is asserted at a logic level high, S1 should be on and S2 should be off. Therefore, in reference to FIG. 3, when S1 is on, each of P00, P01, P10, P11, P20, and P21 should all be on so as to pull Vx high towards Vdd_DCDC, and S2 is off, in which at least N0 is off. However, when pdrv is negated to a logic level low, S2 should be on and S1 should be off. When S2 is on, each of N0, N10, and N11 should be on so as to pull Vx down towards Vss_DCDC, and S1 is off, in which at least P00 and P01 are off. The HS and LS driver circuits control gate voltages of the power switches during transitions in response to pdrv which may help control the $dI_{DD}/dt$ gate drive and the gm and may also help prevent cross conductance between S1 and S2.

Figure 4:
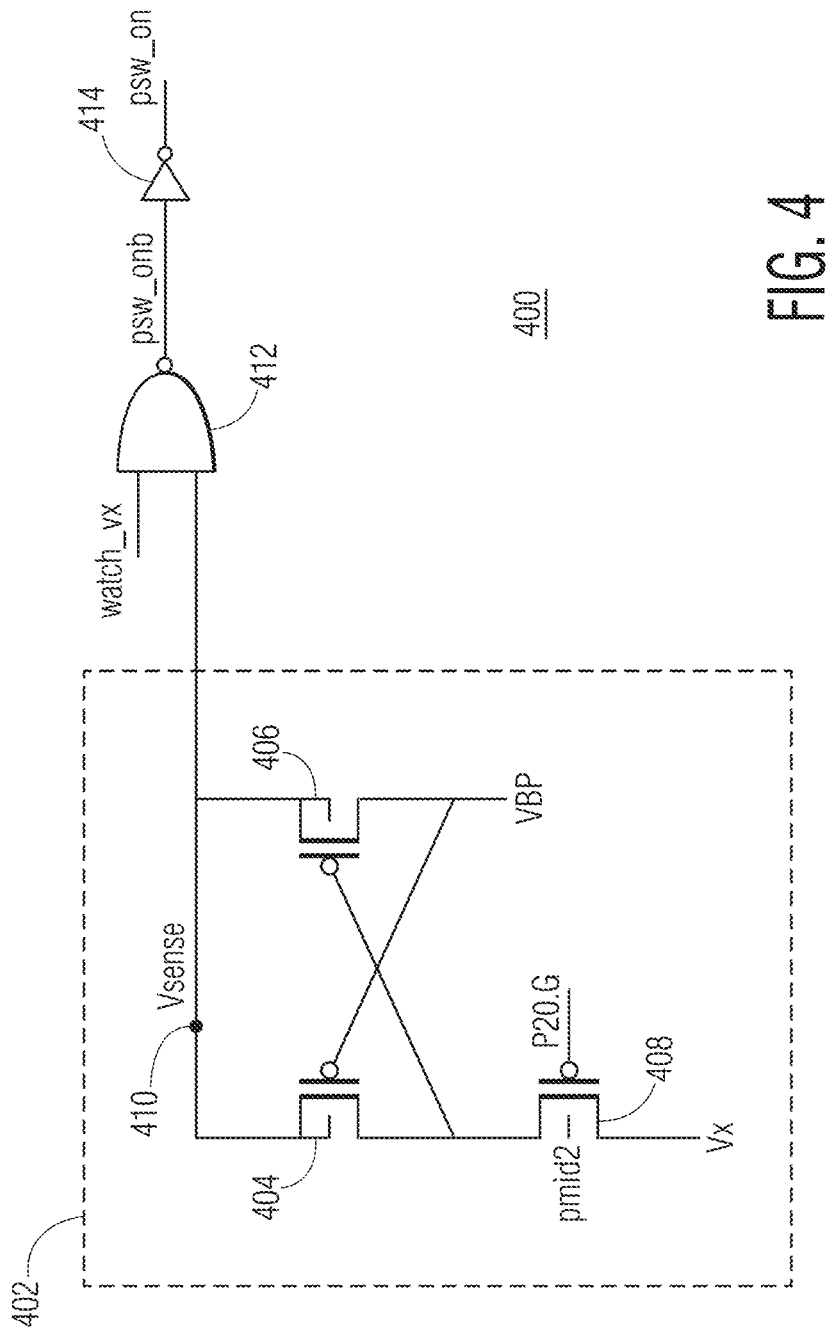
FIG. 4 illustrates, in partial block diagram and partial schematic form, a voltage monitoring circuit which generates a first control signal, in accordance with one embodiment of the present invention.

FIG. 4 illustrates, in partial schematic and partial block diagram form, a voltage monitoring circuit 400 which generates a digital signal output, psw_on, to indicate when S1 is sufficiently on (in which Vx is high enough to consider S1 as being on). Circuit 400 may be included as part of HS driver circuit 106 or may be located elsewhere within converter 100. Circuit 400 includes a replica circuit 402 which mimics P10 and P20, and provides Vsense at a circuit node 410 in which Vsense replicates a version of the output voltage (for example, in one embodiment, Vsense is a clipped representation of Vx which is clipped so that it falls between the positive and negative voltage supplies of HS driver circuit 106, e.g. Vdd_DCDC and VBP, respectively). Replica circuit includes a PMOS transistor 404 which replicates P10 and a PMOS transistor 408 which replicates P20. A first current electrode (e.g. source) of transistor 404 is coupled to circuit node 410, and a second current electrode (e.g. drain) of transistor 404 is coupled to a first current electrode (e.g. source) of transistor 408. A second current electrode (e.g. drain) of transistor 408 is coupled to Vx at circuit node 103, a body terminal of transistor 408 is coupled to circuit node 216 to receive pmid2, and a control electrode (e.g. gate) of transistor 408 is coupled to the gate of P20 (to P20.G). A control electrode (e.g. gate) of transistor 404 is coupled to VBP. A first current electrode (e.g. source) of transistor 406 is coupled to circuit node 410, a control electrode is coupled to the second current electrode of transistor 404, and a second current electrode (e.g. drain) is coupled to VBP. Circuit 400 also includes a NAND gate 412 and an inverter 414. NAND gate 412 is coupled to receive watch_vx at a first input and coupled to receive Vsense at a second input. An output of NAND gate 412 is coupled to an input of inverter 414, and an output of inverter 414 provides psw_on. The output of NAND gate 412 provides psw_onb, in which the "b" following a signal name indicates the inverse of the signal. Therefore, psw_onb is the inverse of psw_on.

In operation, watch_vx is usually asserted to a logic level one (and is only negated to a logic level zero to block leakage currents when not in use). Replica circuit 402 safely passes Vx as Vsense to the input of NAND gate 412. When Vx is low (less than VBP), then the output of NAND 412 is a logic level high, and thus psw_on at the output of inverter 414 is a logic level low (i.e. is negated) to indicate that S1 is not on. However, when Vx is high, the output of NAND gate 412 is a logic level low, and thus psw_on at the output of inverter 414 is asserted to a logic level high to indicate that S1 is on. Note that NAND gate 412 and inverter 414 may be collectively referred to as a logic circuit. Therefore, note that monitor circuit 400 passes pmid2 through a logic circuit to determine the Vx state, in which NAND gate 412 results in causing psw_on to be asserted only once pmid2 is high enough to trigger NAND gate 412. That is, psw_on is asserted once Vx is high enough to result in triggering the logic circuit (i.e. once Vsense reaches a predetermined threshold voltage to trigger the logic circuit).

Figure 5:
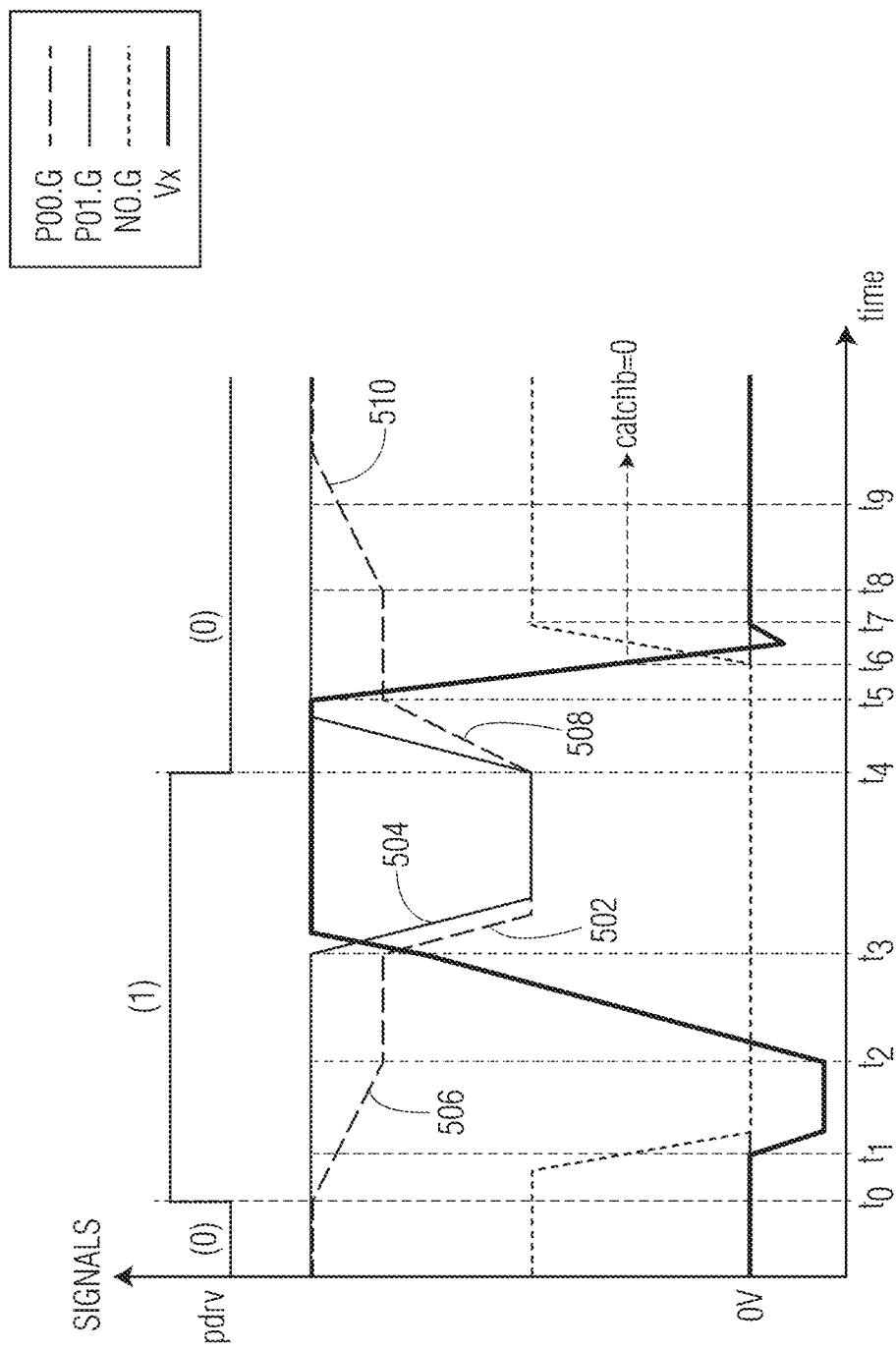
FIG. 5 illustrates a timing diagram with waveforms for a plurality of signals within the portion of the converter illustrated in FIG. 3, in accordance with one embodiment of the present invention.

Operation of FIG. 3 will be described in reference to the waveforms of FIG. 5. Note that a transistor name followed by ".G" indicates the gate voltage of the transistor, the transistor name followed by ".S" indicates the source voltage of the transistor, and the transistor name followed by ".D" indicates that drain voltage of the transistor. FIG. 5 illustrates the voltage waveforms for pdrv, P00.G, P01.G, N0.G, and Vx. (Note that the waveforms of FIG. 5 are approximate and are mainly intended to illustrate relative voltages and transitions, such as, e.g. pdrv vs. Vx and gate voltages, gate voltages vs Vx, P00.G vs P01, etc., but may not represent the exact waveforms or exact voltage values. In one example, each of P00.G and P01.G swing between VBP and Vdd_DCDC, and N0.G swings between Vss_DCDC and VBN. Prior to assertion of pdrv at time t1, S2 is on and S1 is off, which results in Vx being low (at 0V or approximately 0V). Therefore, as illustrated in FIG. 5, P00.G and P01.G are both high which turn off P00 and P01 and N0.G is high which turns on N0. In response to assertion of pdrv, turn-on control circuit 220 begins turning on P00 by gradually pulling down P00.G while MUX 228 (which receives a negated nhighZ at its control input) still maintains P10.G at VBP, which holds P10 on. Also, transistor 232 (with its source at Vss_DCDC), is on, which still maintains P20.G on.

As illustrated in FIG. 3, turn-on control circuit 220 includes an inverter 222 coupled between Vdd_DCDC and VBP and having an input coupled to receive pdrv and an output coupled to the control electrode of P00 to provide P00.G. Inverter 222 includes a pull-up PMOS transistor coupled in series with an NMOS pull-down transistor between Vdd_DCDC and VBP. Turn-on control circuit 220 also includes a PMOS transistor 224, coupled in parallel with the pull-up transistor of inverter 222, having a first current electrode coupled to Vdd_DCDC, a second current electrode coupled to the control electrode of P00, and a control electrode coupled to a control signal represented by "pdrv+psw_onb". Note that, as used herein, "+" and "·" are used to represent the logical operators AND and OR, respectively. Turn-on control circuit 220 also includes an NMOS transistor 226, coupled in parallel with the pull-down transistor of inverter 222, having a first current electrode coupled to VBP, a second current electrode coupled to the control electrode of P00, and a control electrode coupled to receive a control signal represented by "pdrv·(psw_on+nhighZ_latched)", in which nhighZ_latched refers to the value of nhighZ at the rising edge of pdrv. Inverter 222 provides the primary logic state to P00.G based on pdrv, but is a weak inverter having a weak drive strength as compared to transistors 224 and 226, in which transistor 224 has a medium drive strength and transistor 226 has a strong drive strength. In this manner, upon assertion of pdrv, turn-on control circuit 220 gradually pulls down P00.G (due to weak inverter 222), as illustrated by edge 506. Presuming converter 100 is operating in CCCM, nhighZ_latched will be a logic level zero. Since psw_on is not yet asserted (therefore a logic level zero), psw_onb is still a logic level one and nhighZ_latched is also a logic level zero, which maintains transistor 224 off (pdrv+psw_onb=1+0 =1) and transistor 226 off (pdrv·(psw_on+nhighZ_latched)=1·0=0).

FIG. 3 illustrates an example implementation for inverter 222, but alternately, inverter 222 can be implemented with different or more complex designs. For example, each of the pull-up transistor and pull-down transistor can be implemented with any number of transistors, such as with multiple PMOS transistors coupled in parallel with the pull-up transistor and multiple NMOS transistors coupled in parallel with the pull-down transistor. In one embodiment, the multiple PMOS transistors and NMOS transistors are configurable (such as by enabling one or more of the multiple NMOS transistors and enabling one or more of the multiple PMOS transistors) so as to vary the drive strength of the inverter. The variable drive strengths of inverter 222 can therefore be used to further configure the P00 gate slew, and thus $dI_{DD}/dt$.

Therefore, referring to FIG. 5, after time to, P00.G begins to fall, N0.G transitions to low at time t1, turning off N0, and Vx, after an initial drop below zero (due to diode 116, corresponding, e.g., to dip 136 of FIG. 2), begins to rise at time t2. That is, as P00.G falls, S1 gradually takes more of the inductor's current ($I_L$) until Vx begins to rise. First, nmid rises, causing inverter 234 to drive the gate of NMOS transistor 232 low which causes node 208 to become high impedance, and thus causing P20.G to act as a flying capacitor. As S1 turns on more strongly, Vx, pmid2, and pmid1 will all continue to rise. Although not illustrated in FIG. 3, a Miller capacitor is present connected between the control electrode of P00 and Vx (at circuit node 103) which slows down Vx's voltage slew rate, as illustrated with P00.G remaining relatively flat between time t2 and t3. Although P00.G is illustrated as flat, there is a slight positive slope between t2 and t3. The slowing of Vx's slew rate may help avoid current spikes on Vdd_DCDC as Vx sweeps through the non-linear capacitance of the power switches.

After Vsense (which represents the voltage across P00) of Vx monitor circuit 400 in FIG. 4 has sufficiently risen as S1 turns on, Vx monitor circuit 400 asserts psw_on at time t3. The assertion of psw_on causes P00.G to be driven low more quickly (as illustrate by the steeper slope of edge 502 in FIG. 5). That is, with the assertion of psw_on, transistor 226 is turned on which strongly pulls down P00.G. Assertion of psw_on also results in turning on P01 (since the output of inverter 236 is the inverse of pdrv·psw_on which is now zero) and P11 (since MUX 238, due to the select signal at its control input being pdrv·psw_on which is one, causes MUX 238 to provide VBP as P11.G). Note that P01.G is pulled down quickly, similar to P00.G, as illustrated by edge 504 at time t3. When pmid2 sufficiently rises as S1 is turning on, min-of-two circuit 240 provides VBP as the minimum of VBP and pmid2 to P21.G, thus turning on P21. Therefore, while S1 begins to turn on with assertion of pdrv, only once the left half of S1 (e.g. P00 P10, and P20) is sufficiently on as indicated by assertion of psw_on is S1 fully turned on as a result of also turning on the right half (P01, P11, and P21). The delay in turning on the right half allows for the $g_{mp0}$ to be low enough (which corresponds to the $g_m$ of S1) while allowing the slew on P00.G to initially be slowed (e.g. illustrated by edge 506) to obtain the desired $dI_{DD}/dt$. During DCM, $I_{DD}$ is initially zero, so activating S1 will not cause a large $dI_{DD}/dt$. This permits S1 to be switched more rapidly, and this is enabled by nhighZ_latched asserting on the rising edge of pdrv, thereby turning on NMOS 226.

During turning off of S1, in response to negation of pdrv at time t4, the turn-on process is reversed. For example, with pdrv at a logic level zero, P01 and P11 are rapidly turned off (with P01.G set to a logic level one and P11.G set by MUX 238 back to P11.S) while P00.G is gradually turned off. That is, when pdrv is first negated, P00 starts to gradually turn off. At first, upon negation of pdrv to a logic level zero, P00.G begins to increase at a moderate speed (until time t5, as illustrated by edge 508) due to medium strength transistor 224 also being on (since pdrv is still a logic level one, thus psw_onb still a logic level zero). P00.G can turn on at moderate speed at this time since it does not yet control $dI_{DD}/dt$. Once psw_on is negated (at time t5 due to the fall in Vx and pmid1), transistor 224 is turned off and P00.G continues to increase but more slowly. Note that (with nhighZ still low) P10.G and P20.G are still steadily held on with VBP, and P21.G continues to operate normally in which min-of-two circuit 240 tracks the lower of pmid2 and VBP onto P21.G. As Vx falls, eventually nmid will go low, causing inverter 234 to drive high, and NMOS 232 to drive Vss_DCDC onto P20.G. In this manner, Vss_DCDC is used as a cascoding voltage on P20 to balance the voltage drops across P00, P10, and P20. Additionally, once P20.G is pulsed to Vss_DCDC, node 216 will be pulsed a threshold voltage above Vss_DCDC, causing min-of-two circuit 240 to connect P21.G to P21.S. Between times t5 and t8, the increase in P00.G slows due to the Miller capacitor, and at time t8, the increase in P00.G is controlled by inverter 222 (with transistor 224 off) in which P00.G continues to increase towards Vdd_DCDC (illustrated by edge 510) but at a slower rate as compared to the increase illustrated by edge 508. In this manner, between time t8 and t9, the slower increase helps maintain the desired $dI_{DD}/dt$. Once S1 is sufficiently off, S2 can be safely turned on, avoiding cross-conductance.

Therefore, note that splitting S1 into two parts (the left half and right half) allows for improved operation. For example, the gate driver current required to get a safe $dI_{DD}/dt$ through the power switch could be small enough that it would give an excessive delay when charging up the sub-threshold charge of the combination of P00 and P01. However, this delay is managed due to the partitioning of these devices (which are coupled in parallel with each other, as illustrated in FIG. 3) so that the gate driver current drives a smaller subthreshold charge. Also, in the illustrated embodiment of FIG. 3, a longer channel length can be used in P10 to avoid Hot Carrier Injection (HCI) reliability problems, and splitting P10 and P11 (and turning P11 after turning on P10, e.g. by using psw_on to delay the turning on of P11) may allow for P11 to use a shorter channel length as compared to P10, which allows for a reduction in total area. Also, splitting P10 and P11, and discharging P11.G to P11.S, instead of keeping P11.G at VBP, may reduce the total capacitive load that needs to be driven by the VBP regulator when Vx is switching, which may allow for simplifying the VBP regulator design.

Referring back to FIG. 5, with S1 off, S2 is turned on. As will be described in more detail with respect to FIG. 3 in combination with FIGS. 6-9, with S1 off, Vx begins to fall until catchb is asserted to a logic level zero which, when propagated through a logic gate, results in N0.G beginning to turn on at time t6. At time t8, N0.G is on, but, as will be described below, P20 is turned off when nmid goes low (in which "nhighZ+nmid" is provided via inverter 234 to the gate of transistor 232, thus turning on transistor 232 which pulls P20.G to Vss_DCDC). Therefore, similar to turning on S1 by monitoring when Vx rises sufficiently (to result in psw_on at the output of a logic gate to be asserted), S2 is turned on by monitoring when Vx falls sufficiently low, below a predetermined level (to result in catchb at the output of a logic gate to be asserted). Therefore, the turning on of S2 is controlled by nmid, which is propagated through a logic circuit to control N0.G, which helps avoid cross conductance (i.e. transconductance) between S1 and S2 when transitioning from S1 being on to S2 being on. As illustrated in FIG. 3, "pdrv+nhighZ+catchb" is provided via inverter 246 to N0.G.

Figure 6:
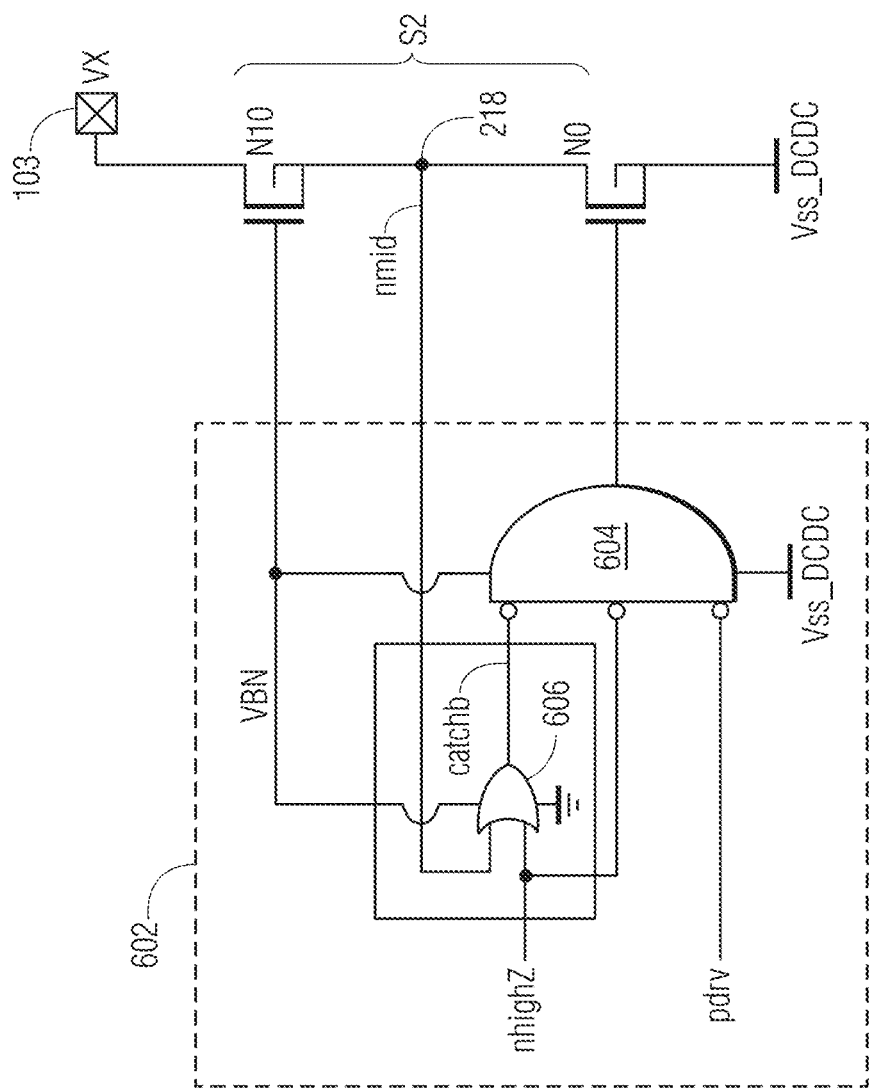
FIG. 6 illustrates, in partial block diagram and partial schematic form, a voltage monitoring circuit which generates a second control signal, in accordance with one embodiment of the present invention.

FIG. 6 illustrates, in schematic form, a Vx monitoring circuit 602 coupled to N10 and N0 of S2, in accordance with an embodiment of the present invention. Monitoring circuit 602 may form part of LS driver circuit 108 and may also be included in the example of FIG. 3 to control N0.G. Note that although not illustrated in FIG. 6, N11 between nodes 103 and 218 may also be present. Monitoring circuit 602 includes an OR gate 606 and an AND gate 604, in which an output of AND gate 604 is coupled to N0.G. AND gate 604 is a 3-input AND gate, in which each input is inverted (as indicated by the circles at each input of the AND gate). A first inverted input is coupled to receive an output of OR gate 606, a second inverted input is coupled to receive nhighZ, and a third inverted input is coupled to receive pdrv. A first input of OR gate 606 is coupled to circuit node 218 to receive nmid, and a second input of OR gate 606 is coupled to receive nhighZ. The output of OR gate 606 provides catchb to the first inverted input of AND gate 604. Note that AND gate 604 provides "pdrv'·nhighZ'·catchb'" to N0.G (in which the apostrophe following the signal name represents the inverted value of the signal), which is the logical equivalent to "(pdrv+nhighZ+catchb)'" provided from inverter 246 to N0.G in FIG. 3. Each of OR gate 606 and AND gate 604 are powered between VBN and Vss_DCDC. Operation of FIG. 6 will be described in reference to the timing diagram of FIG. 7.

Figure 7:
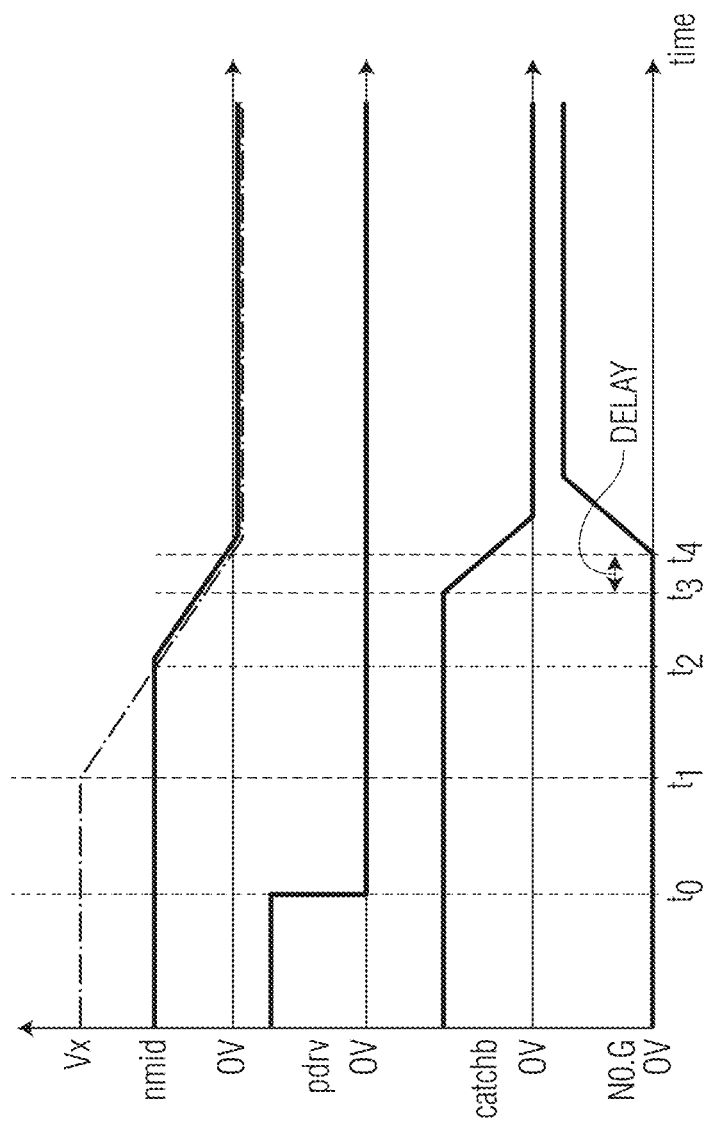
FIG. 7 illustrates a timing diagram with waveforms for a plurality of signals within voltage monitoring circuit of FIG. 6, in accordance with one embodiment of the present invention.

FIG. 7 illustrates waveforms for various signals within monitoring circuit 602 of FIG. 6, in accordance with an embodiment of the present invention. The waveforms of FIG. 7 represent a more detailed portion of the "turning off" portion of the timing diagram of FIG. 5 (in which S1 is turned off and S2 turned on in response to negation of pdrv), and further includes nmid as well as catchb. As described above in reference to FIG. 5, in response to negation of pdrv, Vx begins to drop when P01.G is off and P00.G is turning off (see time t5 in FIG. 5). Note that, while turning on S2, nhighZ is also at a logic level zero. Therefore, referring to FIG. 7, at time t0 of FIG. 7, pdrv is negated and, at time t1, Vx begins to drop. Note that after Vx has fallen low enough, nmid mostly tracks Vx, but lags some. Therefore, while Vx starts to fall at time t1, nmid starts to fall a little later, at time t2. While nmid remains above the trigger point (i.e. trigger or threshold voltage) of OR gate 606, catchb remains negated at a logic level one. With catchb provided to the first inverted input of AND gate 604, the output of AND gate 604 remains at zero. Therefore, although pdrv and nhighZ are both negated to a logic level zero, catchb does not change to a zero until nmid 218 drops low enough to trigger OR gate 606 to toggle its output to a logic level zero.

At time t3, nmid drops sufficiently to trigger OR gate 606 to start switching its output from a logic level one to a logic level zero (i.e. nmid drops below a predetermined voltage level as set by the trigger voltage of OR gate 606). Therefore, as catchb at the output of OR gate 606 decreases from a logic level one to a logic level zero, it triggers AND gate 604 to assert its output to a logic level one (i.e. to toggle its output from a logic level zero to a logic level one) at time t4 (since all 3 inverted inputs to AND gate 604 are now zero). At time t4, with N0.G pulled up to VBN by the output of AND gate 604, N0 begins to turn on (a "delay" time after nmid triggers assertion of catchb to a logic level zero). In this manner, monitoring circuit 602 monitors nmid to "catch" when Vx reaches zero, before falling too low below zero. By waiting until nmid falls sufficiently to toggle the output of OR gate back to zero and the delay added by AND gate 604, improved protection from cross conductance of S1 and S1 can be achieved. Note that when S1 is on, pdrv is high, which forces the output of AND gate 604 to zero, thus turning off N0 (which hold S2 off).

Therefore, with monitor circuit 602, once Vx causes the internal middle node, nmid, of the cascoded S2 switch with N0 and N10 to fall below the OR gate threshold, S2 turns on, as described above. However, when $dI_{DD}/dt$ rates are too slow, this circuit may cause cross conductance (i.e. may result in a direct path current) from power to ground if the delay between Vx sweeping the OR-gate threshold and S2 turning on is faster than the delay between Vx sweeping the OR-gate threshold and Vx reaching a negative voltage. Therefore, in one embodiment, as will be described below in reference to FIGS. 8 and 9, a common-gate amplifier may be used so that S2 is activated only after Vx causes nmid to reach a negative voltage. At that point, the circuit latches that a negative voltage has been observed, and S2 stays on until either nhighZ or pdrv asserts.

Figure 8:
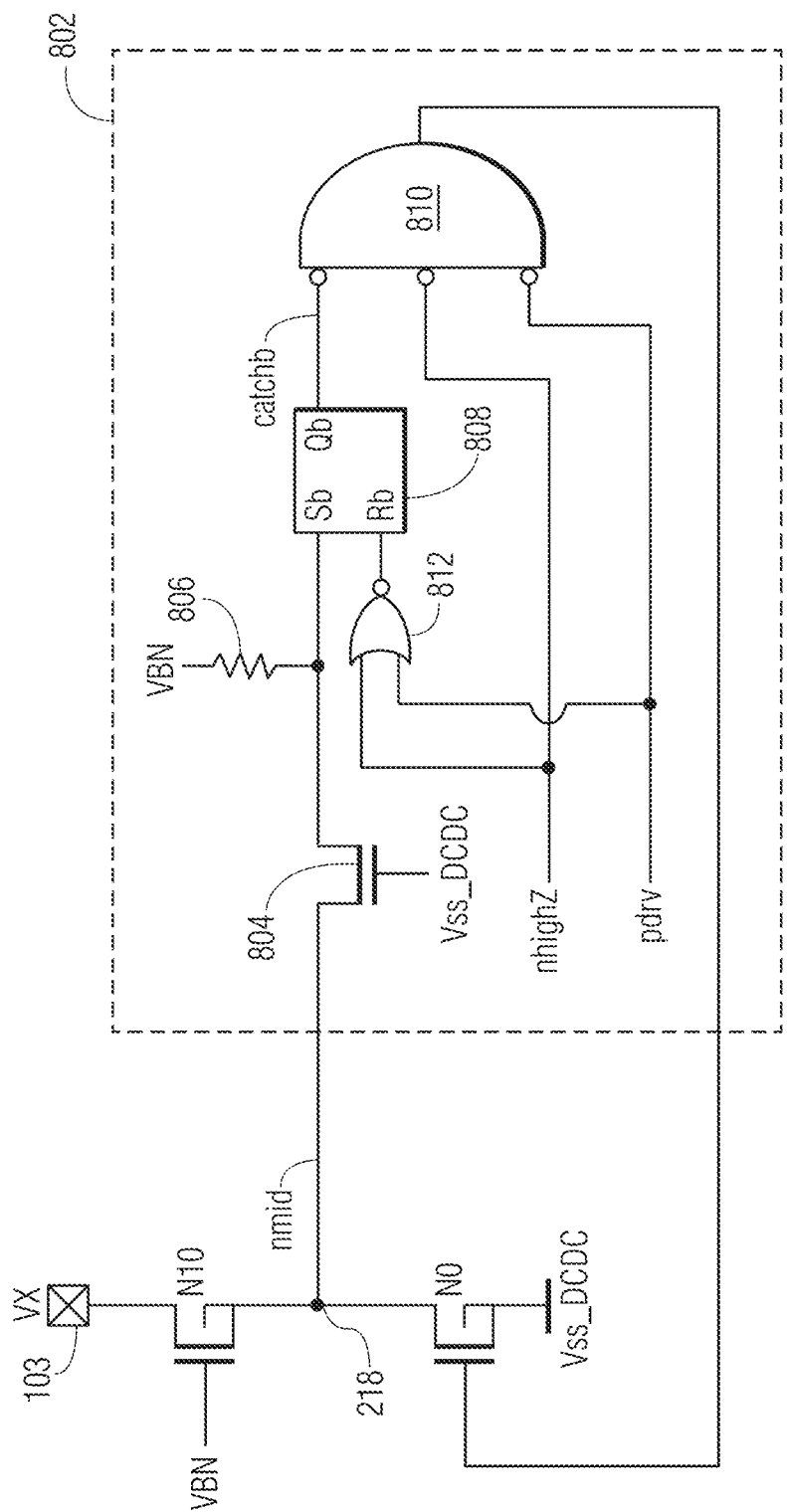
FIG. 8 illustrates, in partial block diagram and partial schematic form, a voltage monitoring circuit which generates the first control signal, in accordance with another embodiment of the present invention.

FIG. 8 illustrates, in schematic form, a Vx monitoring circuit 802 coupled to N10 and N0 of S2, in accordance with an embodiment of the present invention. Monitoring circuit 802 may form part of LS driver circuit 108 and may also be included in the example of FIG. 3 (e.g. instead of Vx monitoring circuit 602) to control N0.G. Note that although not illustrated in FIG. 8, N11 between nodes 103 and 218 may also be present. Monitor circuit 802 is implemented with common-gate amplifier having an NMOS transistor having a first current electrode coupled to circuit node 218 to receive nmid, a control electrode coupled to Vss_DCDC, and a second current electrode coupled to an Sb input of SR-latch 808. SR-latch 808 has an inverse set (Sb) input and an inverse reset (Rb) input and provides an inverse output (Qb). When the Sb input is asserted at a logic level zero, the inverted output is asserted as a zero (such that catchb is asserted to a logic level zero), and when the Rb input is asserted at a logic level zero, the inverted output is reset to a one (such that catchb is negated to a logic level one). Monitor circuit 802 includes a NOR gate 812, having a first input coupled to receive nhighZ and a second input coupled to receive pdrv, and an output coupled to the Rb input of SR latch 808. Monitor circuit 802 also includes a 3-input AND gate in which each input is inverted (as indicated by the circles at each input of the AND gate). A first inverted input is coupled to receive the Qb output as catchb from SR latch 808, a second inverted input is coupled to receive nhighZ, and a third inverted input is coupled to receive pdrv. (Note that, similar to AND gate 604, AND gate 810 provides "pdrv'·nhighZ'·catchb'" to N0.G, which is the logical equivalent of "(pdrv+nhighZ+catchb)'" provided from inverter 246 to N0.G in FIG. 3.) Operation of FIG. 8 will be described in reference to the timing diagram of FIG. 9.

Figure 9:
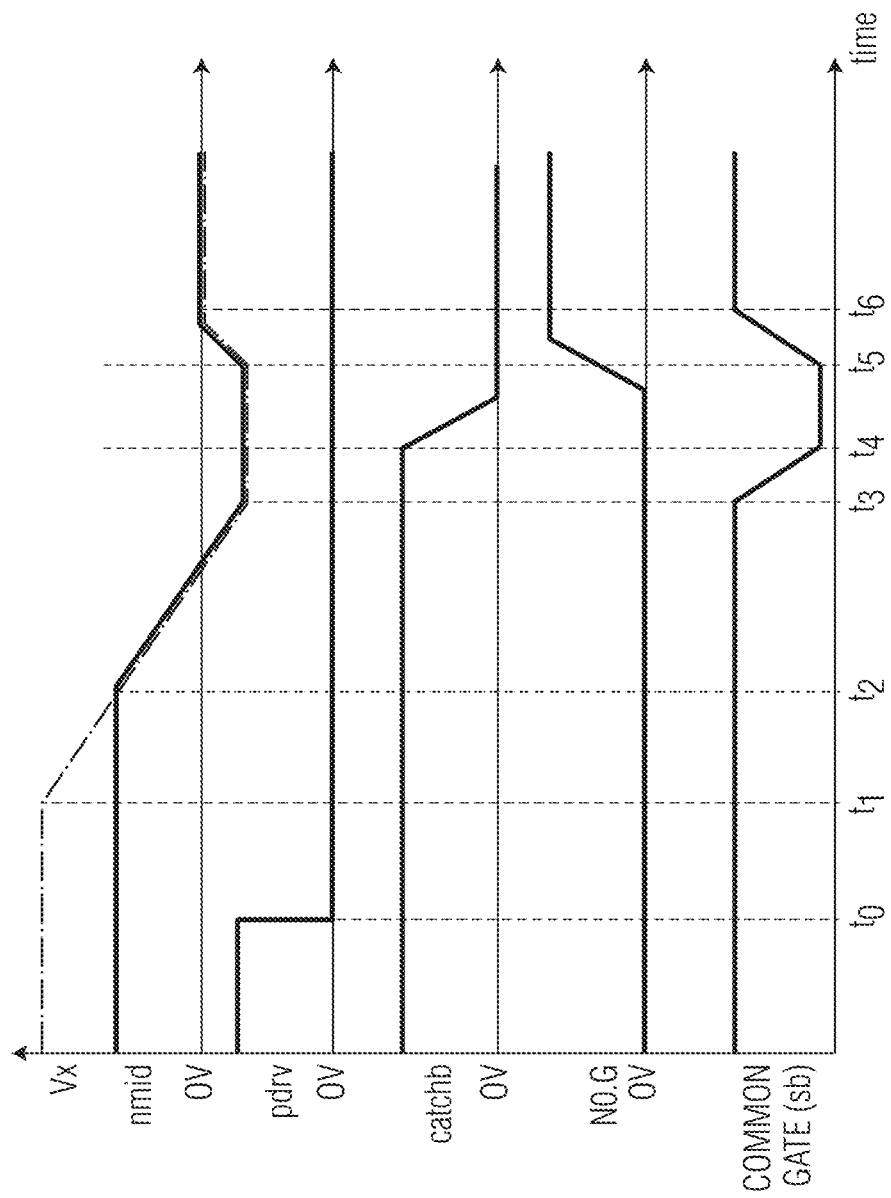
FIG. 9 illustrates a timing diagram with waveforms for a plurality of signals within voltage monitoring circuit of FIG. 8, in accordance with one embodiment of the present invention.

FIG. 9 illustrates waveforms for various signals within monitoring circuit 802 of FIG. 8, in accordance with an embodiment of the present invention. The waveforms of FIG. 8 (similar to those of FIG. 6) represent a more detailed portion of the "turning off" portion of the timing diagram of FIG. 5 (in which S1 is turned off and S2 turned on in response to negation of pdrv), and further includes the common gate of the common-gate amplifier (i.e. the Sb input of SR latch 808) as well as nmid and catchb. As described above in reference to FIG. 5, in response to negation of pdrv, Vx begins to drop when P01.G is off and P00.G is turning off (see time t5 in FIG. 5). Note that, while turning on S2, nhighZ is also at a logic level zero. Therefore, referring to FIG. 9, at time to of FIG. 9, pdrv is negated and, at time t1, Vx begins to drop. Note that after Vx has fallen low enough, nmid mostly tracks Vx, but lags some. Therefore, while Vx starts to fall at time t1, nmid starts to fall a little later, at time t2. While nmid remains positive, catchb remains at its previously latched state of a logic level one.

However, once nmid drops below zero and is sufficiently negative to turn on transistor 804 (e.g. falls below a predetermined level as set by the voltage on the gate electrode of transistor 804 and the threshold voltage of transistor 804), nmid is provided to the Sb input of SR latch 808 (as a logic level zero), which asserts the Sb input, resulting in setting (asserting) Qb to a logic level zero. Therefore, at time t4 catchb, at the Qb output of SR latch 808 is asserted to a logic level zero.

Similar to AND gate 604 of monitor circuit 602, assertion of catchb to a logic level zero causes the output of AND gate 810 to transition or toggle from a logic level zero to a logic level one, which turns on N0. At time t5, with N0 on, Vx and nmid are pulled up to zero, which turns off transistor 804. With transistor 804 off, at time t6, the Sb input is pulled up to VBN via resistor 806. When either nhighZ is asserted to a logic level one or pdrv is asserted to a logic level one (such as when S1 is turned on again), the output of AND gate 810 is forced back to a logic level zero, thus turning off N0. Similarly, asserting either nhighZ or pdrv will cause NOR gate 812 to assert the Rb input to SR latch 808, negating catchb to a logic level one, in preparation of the next time Vx will fall. In this manner, the threshold at which Vx toggles is kept strictly below 0V so that there is no risk of cross conduction, regardless of any delays (such as logic delays, etc.).

Note that in the embodiments of FIGS. 6 and 8, each of AND gate 604, AND gate 810, and OR gate 606, and SR latch 808 may simply be referred to as a logic gate (in which, the logic gate may include inverted inputs, such as in the case of AND gates 604 and 810 and SR latch 808), in which each logic gate performs a corresponding logic function. Note also that with either the embodiment of FIG. 6 or 8, while catchb is at a logic level one, the output of inverter 244 to the control input of MUX 242 remains negated at a logic level zero, which results in connecting N11.G to N11.S. However, when catchb is asserted to a logic level zero (with both pdrv and nhighZ still being zero), the output of inverter 244 is asserted to a logic level one such that MUX 242 applies VBN to N11.G, thus turning on N11 as well, which helps drive Vx to Vss_DCDC with lower resistance.

As described above, the transistors within S1 and S2 are cascoded to handle DC voltage drops to prevent any transistors from experiencing a voltage above its voltage rating (outside its SOA). For example, Vdd_DCDC may be 3.3V, and mid-rail biases VBP and VBN may be 1.5V and 1.8V, respectively. However, due to the topology of P20 being furthest from Vdd_DCDC (as compared to P00 and P10), voltage constraints on P20.G need to be carefully applied so as to prevent damage. For example, in the case that S1 is on, the source of P20 may go to Vdd_DCDC, thus P20.G should be limited to being greater than 1.3V (=Vdd_DCDC−2V) to protect P20, but in the case that S2 is on, the drain of P20 may go as far down as −1V, thus P20.G should be limited to being less than 1V to protect P20. Because these two ranges (greater than 1.3V and less than 1V are not overlapping), the bias on P20.G needs to toggle. Therefore, transistors 230 and 232, as controlled by nhighZ and nmid, allow the bias on P20.G to toggle appropriately. For example, when P20.S goes high when S1 on, VBP is applied as the bias on P20.G (because the control signal provided by "nhighZ+nmid" is a logic level high at the input of inverter 234, therefore the output of inverter 234 turns off transistor 232 while transistor 230 is on due to pmid2, driven near Vdd_DCDC, on its gate such that VBP is applied to circuit node 208 at P20.G). However, when P20.D goes low when S2 is on, Vss_DCDC is applied as the bias on P20.G (because the control signal provided by "nhighZ+nmid" is a logic level low at the input of inverter 234, thus turning on transistor 232 while transistor 230 is off such that Vss_DCDC is applied to circuit node 208 at P20.G). In this manner, the bias on P20.G toggles between VBP and Vss_DCDC to prevent damage of P20.G.

Note that, in one embodiment, min-of-two circuit 240 can be implemented using two NMOS devices in which a first current electrode (e.g. drain) of a first device is coupled to receive a first input voltage and a first current electrode (e.g. drain) of a second device is coupled to receive a second input voltage. A control electrode of the first device is coupled to the drain of the second device, and a control electrode of the second device is coupled to the drain of the first device. Second current electrodes (e.g. sources) of each of the first and second devices are connected and provide an output voltage which represents the minimum of the first and second input voltages. Each of the first and second device may have its source connected to its body. Note that, in other embodiments, other circuitry may be used to implemented min-of-two circuit 240.

Note also that the waveforms illustrated in each of FIGS. 2, 5, 7 and 9 are approximate, intended to give high level explanations and relative transitions but may not represent the exact waveforms. Also, note that in alternate embodiments, different logic circuitry may be used to implement the digital logic of FIGS. 6 and 8. For example, more, fewer, or different logic gates may be used. Also, in one embodiment, nhighZ may not be used, or may instead be represented by multiple control signals. Each of MUXes 228, 238, and 242 represent an analog MUX intended to pass a voltage at one of its inputs to its output, based on a control or select signal received at its control input. Each MUX can be implemented as known in the art. Also, since each of each of MUXes 228 and 238, and inverters 236, may also be implemented with low voltage devices, they can also be powered between Vdd_DCDC and VBP, similar to turn-on control circuit 220. Similarly, MUX 242 and inverter 246, as well as the logic gates within monitor circuits 602 and 802, may also be implemented with low voltage devices and thus can be powered between VBN and Vss_DCDC.

Therefore, by now it can be appreciated that a DC-DC converter is provided which controls transitions between states of its power switch to help prevent cross conductance within the power switch and to help control the dI$_{DD}$/dt and g$_m$ of the power switch (which may limit the impact of inductive parasitics). For example, in one aspect, a voltage monitor is coupled to a middle node (e.g. nmid) of the cascoded devices of the LS switch (S2), in which a logic circuit which is sensitive to both the logic state of the HS switch (e.g. indicated by pdrv) and the logic state of the voltage monitor (e.g. indicated by catchb). In this example, the logic circuit operates to control an NMOS transistor of S2 that is closest to the power supply (e.g. Vss_DCDC) such that S2 will activate after S1 has begun to turn off and the middle node (e.g. nmid) of S2 has fallen below a predetermined voltage level. The logic circuit can be implemented using any combination of logic gates, such as an OR gate, AND gates, SR latch, etc. In one embodiment, the predetermined voltage level corresponds to a trigger voltage of a logic gate within the logic circuit. In another embodiment, the predetermined voltage level is based on a gate voltage of a common gate amplifier. For example, in another aspect, an assembly of six PMOS transistors are grouped to include three series connected pairs of parallel devices (resulting in a left half and right half of the HS switch (S1)). A gate driver circuit controls a first PMOS transistor closest to the power supply in the left half of S1 to slow down the turning on of S1 (thus lowering $dI_{DD}/dt$), and gate driver circuits of the right half of S1 rely on a voltage monitor coupled to a middle node (e.g. pmid2) of the cascoded devices of S1 to turn on the right half of S1, which may operate to reduce the $g_m$ (e.g. resistance) of the power switch. In this example, by monitoring the middle node (e.g. pmid2) of S1, the voltage monitor determines whether the left half of S1 is sufficiently on so as to assert a control signal (e.g. psw_on) to turn on the right half of S1. Note that in either aspect described above, a voltage monitor circuit observes the voltage at a circuit node (e.g. at Vx) between the LS and HS switch by using midpoints of the cascoded devices (e.g. by using nmid or pmid2).

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "b" following the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different applications. For example, although FIG. 1 and the discussion thereof describe an exemplary configuration of a DC-DC converter, this exemplary configuration is presented merely to provide a useful reference in discussing various aspects of the invention. Therefore, the description of the architecture has been simplified for purposes of discussion, and it is just one of many different types of converters and configurations that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the configurations depicted herein are merely exemplary, and that in fact many other configurations can be implemented which achieve the same functionality.

Also for example, in one embodiment, the illustrated elements of converter 100 are circuitry located on a single integrated circuit or within a same device, in which, for example, converter 100 can be implemented in a system on a chip (SoC). Alternatively, converter 100 may be used in a system which includes any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, Each of S1 and S2 of converter 100 may include more cascoded transistors than those illustrated in the example of FIG. 3. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In an embodiment, a cascoded power switch includes a high-side (HS) switch coupled between an output node configured to provide an output voltage and a first voltage supply terminal configured to provide a first voltage supply; a low-side (LS) switch coupled between the output node and a second voltage supply terminal configured to provide a second voltage supply, lower than the first voltage supply, wherein the LS switch includes a first transistor coupled between a middle node and the second voltage supply terminal, and a second transistor coupled between the middle node and the output node; and a LS driver circuit having a voltage monitoring circuit configured to receive a first control signal which, when negated, turns off the HS switch, wherein the voltage monitoring circuit includes a logic circuit having a first input configured to receive the first control signal and a second input coupled to the middle node, and an output coupled to a control electrode of the first transistor. In one aspect, in response to a voltage at the middle node dropping below a predetermined level, the logic circuit toggles its output to turn on the first transistor which turns on the LS switch. In a further aspect, a second control signal is asserted when the voltage at the middle node drops below the predetermined level, wherein, while the first control signal is negated, assertion of the second control signal causes the logic circuit to toggle its output to turn on the first transistor which turns on the LS switch. In yet a further aspect, the logic circuit includes a logic gate having a first input coupled to receive the first control signal and a second input coupled to receive the second control signal, wherein an output of the logic gate provides the output of the logic circuit. In yet an even further aspect, the logic circuit includes a second logic gate having an input coupled to the middle node and an output configured to provide the second control signal, wherein the predetermined level is determined by a threshold voltage of the second logic gate. In yet an even further aspect, the voltage monitoring circuit is configured to receive a third control signal which, when asserted, indicates that the HS switch and the LS switch are off such that the output node is in a high impedance state. In yet an even further aspect, a second input of the second logic gate and a third input of the logic gate is configured to receive the third control signal. In another aspect, the logic circuit includes a second logic gate having an output configured to provide the second control signal, and the voltage monitoring circuit includes a third transistor having a first current electrode coupled to the middle node and a second current electrode coupled to a first input of the second logic gate, wherein the third transistor provides the voltage at the middle node to the first input of the second logic gate when the voltage at the middle node drops below the predetermined level. In a further aspect, the predetermined level is less than the second voltage supply such that the logic circuit toggles its output to turn on the first transistor which turns on the LS switch only when a voltage at the output node is less than the second voltage supply. In another aspect, the second logic gate includes an SR latch, wherein an inverted set input of the SR latch is coupled to the second current electrode of the third transistor and an inverted output of the SR latch is configured to provide the second control signal. In a further aspect, a reset input of the SR latch receives an input based on the first control signal. In yet another aspect, a control electrode of the second transistor is coupled to a bias voltage, and a voltage on the output node begins to decrease in response to the HS switch being turned off. In a further aspect, the LS switch further includes a third transistor coupled between the middle node and the output node, in parallel with the second transistor, wherein a control electrode of the third transistor receives the bias voltage when the first control signal is negated and the second control signal is asserted.

In another embodiment, a cascoded power switch includes a high-side (HS) switch coupled between an output node configured to provide an output voltage and a first voltage supply terminal configured to provide a first voltage supply; a low-side (LS) switch coupled between the output node and a second voltage supply terminal configured to provide a second voltage supply, lower than the first voltage supply, wherein the LS switch includes a first transistor coupled between a middle node and the second voltage supply terminal, and a second transistor coupled between the middle node and the output node; and a LS driver circuit having a voltage monitoring circuit configured to receive a first control signal which, when negated, turns off the HS switch, assert a second control signal when a voltage at the middle node drops below a predetermined level, and, in response to assertion of the second control signal while the first control signal is negated, turns on the LS switch by turning on the first transistor. In one aspect, a control electrode of the second transistor is coupled to a bias voltage, and a voltage on the output node and the voltage at the middle node begin to decrease in response to the HS switch being turned off. In a further aspect, the voltage monitoring circuit includes a logic circuit configured to assert the second control signal, the logic circuit having a first input coupled to the middle node, a second input coupled to receive the first control signal, and an output coupled to a control electrode of the first transistor, wherein the predetermined level corresponds to a trigger voltage of the logic circuit. In another further aspect, the voltage monitoring circuit includes a third transistor implemented as a common gate amplifier, wherein the third transistor has a first current electrode coupled to the middle node, a control electrode coupled to the second voltage supply terminal, and a third electrode coupled to an input of a logic circuit, wherein an output of the logic circuit is coupled to a control electrode of the first transistor, and wherein the predetermined level corresponds to a voltage less than the second voltage supply.

In yet another embodiment, a method, in a cascoded power switch having a high-side (HS) switch coupled between an output node configured to provide an output voltage and a first voltage supply terminal configured to provide a first voltage supply, and a low-side (LS) switch coupled between the output node and a second voltage supply terminal configured to provide a second voltage supply, lower than the first voltage supply, includes: in response to turning off the HS switch, allowing the output voltage to decrease; monitoring a voltage on a circuit node between series-connected NMOS transistors of the LS switch, wherein the series-connected NMOS transistors are coupled between the output node and the second voltage supply terminal; and while the HS switch is off, in response to the voltage at the circuit node dropping below a predetermined level, turning on an NMOS transistor of the series-connected NMOS transistors which is located closest to the second voltage supply terminal so as to turn on the LS switch. In one aspect, the predetermined level corresponds to a trigger voltage of a logic gate within a logic circuit having an input coupled to receive the voltage on the circuit node and having an output configured to control turning on the NMOS transistor of the series-connected NMOS transistors which is located closest to the second voltage supply terminal. In another aspect, the predetermined level is based on a gate voltage applied to a control electrode of a common gate amplifier coupled between the circuit node and an input of a logic circuit whose output is configured to control turning on the NMOS transistor of the series-connected NMOS transistors which is located closest to the second voltage supply terminal.

What is claimed is:
1. A cascoded power switch, comprising:
a high-side (HS) switch coupled between an output node configured to provide an output voltage and a first voltage supply terminal configured to provide a first voltage supply;
a low-side (LS) switch coupled between the output node and a second voltage supply terminal configured to provide a second voltage supply, lower than the first voltage supply, wherein the LS switch comprises:
 a first transistor coupled between a middle node and the second voltage supply terminal, and a second transistor coupled between the middle node and the output node; and a LS driver circuit having a voltage monitoring circuit configured to receive a first control signal which, when negated, turns off the HS switch, wherein the voltage monitoring circuit includes a logic circuit having a first input configured to receive the first control signal and a second input coupled to the middle node, and an output coupled to a control electrode of the first transistor.

2. The cascoded power switch of claim 1, wherein, in response to a voltage at the middle node dropping below a predetermined level, the logic circuit toggles its output to turn on the first transistor which turns on the LS switch.

3. The cascoded power switch of claim 2, wherein a second control signal is asserted when the voltage at the middle node drops below the predetermined level, wherein, while the first control signal is negated, assertion of the second control signal causes the logic circuit to toggle its output to turn on the first transistor which turns on the LS switch.

4. The cascoded power switch of claim 3, wherein a control electrode of the second transistor is coupled to a bias voltage, and a voltage on the output node begins to decrease in response to the HS switch being turned off.

5. The cascoded power switch of claim 4, wherein the LS switch further comprises:

a third transistor coupled between the middle node and the output node, in parallel with the second transistor, wherein a control electrode of the third transistor receives the bias voltage when the first control signal is negated and the second control signal is asserted.

6. The cascoded power switch of claim 3, wherein the logic circuit comprises a logic gate having a first input coupled to receive the first control signal and a second input coupled to receive the second control signal, wherein an output of the logic gate provides the output of the logic circuit.

7. The cascoded power switch of claim 6, wherein the logic circuit comprises a second logic gate having an input coupled to the middle node and an output configured to provide the second control signal, wherein the predetermined level is determined by a threshold voltage of the second logic gate.

8. The cascoded power switch of claim 7, wherein the voltage monitoring circuit is configured to receive a third control signal which, when asserted, indicates that the HS switch and the LS switch are off such that the output node is in a high impedance state.

9. The cascoded power switch of claim 8, wherein a second input of the second logic gate and a third input of the logic gate is configured to receive the third control signal.

10. The cascoded power switch of claim 6, wherein the logic circuit comprises a second logic gate having an output configured to provide the second control signal, and the voltage monitoring circuit comprises:

a third transistor having a first current electrode coupled to the middle node and a second current electrode coupled to a first input of the second logic gate, wherein the third transistor provides the voltage at the middle node to the first input of the second logic gate when the voltage at the middle node drops below the predetermined level.

11. The cascoded power switch of claim 10, wherein the predetermined level is less than the second voltage supply such that the logic circuit toggles its output to turn on the first transistor which turns on the LS switch only when a voltage at the output node is less than the second voltage supply.

12. The cascoded power switch of claim 10, wherein the second logic gate comprises:

an SR latch, wherein an inverted set input of the SR latch is coupled to the second current electrode of the third transistor and an inverted output of the SR latch is configured to provide the second control signal.

13. The cascoded power switch of claim 12, wherein a reset input of the SR latch receives an input based on the first control signal.

14. A cascoded power switch, comprising:

a high-side (HS) switch coupled between an output node configured to provide an output voltage and a first voltage supply terminal configured to provide a first voltage supply;

a low-side (LS) switch coupled between the output node and a second voltage supply terminal configured to provide a second voltage supply, lower than the first voltage supply, wherein the LS switch comprises:

a first transistor coupled between a middle node and the second voltage supply terminal, and a second transistor coupled between the middle node and the output node; and a LS driver circuit having a voltage monitoring circuit configured to:

receive a first control signal which, when negated, turns off the HS switch, assert a second control signal when a voltage at the middle node drops below a predetermined level, and, in response to assertion of the second control signal while the first control signal is negated, turns on the LS switch by turning on the first transistor.

15. The cascoded power switch of claim 14, wherein a control electrode of the second transistor is coupled to a bias voltage, and a voltage on the output node and the voltage at the middle node begin to decrease in response to the HS switch being turned off.

16. The cascoded power switch of claim 15, wherein the voltage monitoring circuit comprises a logic circuit configured to assert the second control signal, the logic circuit having a first input coupled to the middle node, a second input coupled to receive the first control signal, and an output coupled to a control electrode of the first transistor, wherein the predetermined level corresponds to a trigger voltage of the logic circuit.

17. The cascoded power switch of claim 15, wherein the voltage monitoring circuit comprises a third transistor implemented as a common gate amplifier, wherein the third transistor has a first current electrode coupled to the middle node, a control electrode coupled to the second voltage supply terminal, and a third electrode coupled to an input of a logic circuit, wherein an output of the logic circuit is coupled to a control electrode of the first transistor, and wherein the predetermined level corresponds to a voltage less than the second voltage supply.

18. A method comprising:

providing a cascoded power switch having a high-side (HS) switch coupled between an output node and a first voltage supply terminal, and a low-side (LS) switch coupled between the output node and a second voltage supply terminal;

in response to turning off the HS switch, allowing an output voltage at the output node to decrease;

monitoring a voltage on a circuit node between series-connected NMOS transistors of the LS switch, wherein the series-connected NMOS transistors are coupled between the output node and the second voltage supply terminal; and while the HS switch is off, in response to the voltage on the circuit node dropping below a predetermined level, turning on an NMOS transistor of the series-connected NMOS transistors which is located closest to the second voltage supply terminal so as to turn on the LS switch.

19. The method of claim 18, wherein the turning on the NMOS transistor of the series-connected NMOS transistors which is located closest to the second voltage supply terminal in response to the voltage on the circuit node dropping below the predetermined level is performed such that the predetermined level corresponds to a trigger voltage of a logic gate within a logic circuit having an input coupled to receive the voltage on the circuit node and having an output configured to control turning on the NMOS transistor of the series-connected NMOS transistors which is located closest to the second voltage supply terminal.

20. The method of claim 18, wherein the turning on the NMOS transistor of the series-connected NMOS transistors which is located closest to the second voltage supply terminal in response to the voltage on the circuit node dropping below the predetermined level is performed such that the predetermined level is based on a gate voltage applied to a control electrode of a common gate amplifier coupled between the circuit node and an input of a logic circuit whose output is configured to control turning on the NMOS transistor of the series-connected NMOS transistors which is located closest to the second voltage supply terminal.

* * * * *